United States Patent [19]

Nakagawa et al.

[11] Patent Number: 4,982,251
[45] Date of Patent: Jan. 1, 1991

[54] SEMICONDUCTOR ELEMENT

[75] Inventors: Katsumi Nakagawa, Tokyo; Toshiyuki Komatsu, Yokohama; Yutaka Hirai, Tokyo; Yoshiyuki Osada, Yokosuka; Satoshi Omata, Tokyo; Takashi Nakagiri, Tokyo, all of Japan

[73] Assignee: Canon Kabushiki Kaisha, Tokyo, Japan

[21] Appl. No.: 511,952

[22] Filed: Apr. 17, 1990

Related U.S. Application Data

[63] Continuation of Ser. No. 203,613, Jun. 2, 1988, abandoned, which is a continuation of Ser. No. 846,480, Mar. 31, 1986, abandoned, which is a continuation of Ser. No. 456,716, Jan. 10, 1983, abandoned.

[30] Foreign Application Priority Data

Jan. 19, 1982 [JP] Japan ................................. 57-7163

[51] Int. Cl.$^5$ .............................................. H01L 29/78
[52] U.S. Cl. ........................................ 357/23.7; 357/2; 357/4; 357/59
[58] Field of Search .................. 357/4, 59, 59 A, 23.7, 357/2

[56] References Cited

U.S. PATENT DOCUMENTS

| | | | |
|---|---|---|---|
| 3,791,024 | 2/1974 | Boleky | 357/23.7 |
| 4,409,424 | 10/1983 | Devaud | 357/59 |
| 4,409,605 | 10/1983 | Ovshinsky et al. | 357/59 |
| 4,433,202 | 2/1984 | Maruyama et al. | 357/59 |
| 4,434,318 | 2/1984 | Gibbons | 357/59 |
| 4,441,973 | 4/1984 | Noguchi | 357/2 |
| 4,453,173 | 6/1984 | Carlson et al. | 357/59 |
| 4,719,501 | 1/1988 | Nakagawa et al. | 357/2 |
| 4,740,829 | 4/1988 | Nakagiri et al. | 357/2 |
| 4,766,477 | 8/1988 | Nakagawa et al. | 357/2 |
| 4,905,072 | 2/1990 | Komatsu et al. | 357/2 |

FOREIGN PATENT DOCUMENTS 55-11329 1/1980 Japan ................................. 357/59 A

OTHER PUBLICATIONS

H. Matsumora et al., "Cond . . . Hydrogen", J. Appl. Phys., vol. 52, #1, Jan. 1981, pp. 291-295.
O. Busmundrud, "Prop. of Amorph-Cryst Si JCNS.", Phys. Stat. 502, vol. 28, pp. 255-262, 1975.

Primary Examiner—Rolf Hille
Assistant Examiner—Steven Lake
Attorney, Agent, or Firm—Fitzpatrick, Cella, Harper & Scinto

[57] ABSTRACT

A semiconductor element comprises its main part constituted of a polycrystalline silicon semiconductor layer containing 0.01 to 1 atomic % of fluorine atoms.

7 Claims, 5 Drawing Sheets

SEMICONDUCTOR ELEMENT

This application is a continuation of application Ser. No. 203,613 filed June 2, 1988, which is a continuation of 846,480, filed Mar. 31, 1986 which is a continuation of 456,716, filed Jan. 10, 1983, all now abandoned.

BACKGROUND OF THE INVENTION

1. Field of the Invention

This invention relates to a semiconductor element such as a field effect thin film transistor, and the like, more particularly to a semiconductor element of which the main part is constituted of a polycrystalline silicon thin film semiconductor layer which is of high quality in behavior characteristics, reliability and stability.

2. Description of the Prior Art

Recently, for constitution of a scanning circuit portion of an image reading device for use in image reading such as one-dimensional photosensor made in a continuous length of two-dimensional photosensor of an enlarged area, or for constitution of a driving circuit portion of an image display device utilizing liquid crystal (abbreviated as LC), electrochromic material (abbreviated as EC) or electroluminescence material (abbreviated as EL), it has been proposed to form a field effect thin film transistor by using as the base material a silicon thin film formed on a certain substrate, corresponding in size to the increased area of such portions.

Such a silicon thin film is desired to be polycrystalline rather than amorphous for realization of a large scale image reading device or image display device improved in having a higher speed and achieving a higher level of function. As one of the reasons, in spite of the requirement that the effective carrier mobility $\mu$eff of a silicon thin film as base material for formation of a scanning circuit portion of such a high speed, high function reading device or driving circuit portion of image display device should be large, that of the amorphous silicon thin film obtained by the ordinary discharge decomposition method is at most 0.1 cm$^2$/V.sec, and, it also suffers from the drawback that the drain current is reduced as DC voltage is applied to the gate, whereby there is a marked change with the lapse of time such as shifting of the threshold voltage of the transistor, resulting in poor in stability.

In contrast, a polycrystalline silicon thin film has an effective carrier mobility $\mu$eff by far greater than an amorphous silicon thin film as can be seen from the data practically measured. Theoretically, it is quite probable that there may be prepared a polycrystalline silicon thin film having a further increased value of mobility $\mu$eff than presently obtained.

However, under the present situation, a semiconductor element or a semiconductor device comprising as its main part a semiconductor layer of a polycrystalline silicon thin film prepared by various methods of the prior art does not exhibit sufficiently the desired characteristics and reliability. There have been also made so many studies about the semiconductor elements formed from amorphous silicon thin films containing silicon and fluorine. However, thin film field effect transistors in which amorphous silicons containing silicon and fluorine are used as semiconductor layers have small effective mobilities, and also suffer from the drawback of a large change with lapse of time such that the drain current is reduced as a DC voltage is applied on the gate with a shift of the threshold voltage of the transistor, thus being poor in stability.

SUMMARY OF THE INVENTION

The present inventors have made extensive studies in view of the above points on the basis of an idea that the characteristics and reliability at the junction interface of most semiconductor elements having junctions of laminar structures (PN junction or MIS structure) will determine the performance and reliability of such elements, and consequently found that in a polycrystalline silicon thin film semiconductor element, the content of fluorine atoms in the silicon thin film will determine the performance and reliability of the element.

A principal object of the present invention is to provide a semiconductor element having a polycrystalline silicon thin film semiconductor layer of high performance.

It is another object of the present invention is to provide a field effect thin film transistor having high performance, high reliability and high stability, by use of a polycrystalline silicon thin film semiconductor formed on a substrate.

It is a further object of the present invention is to provide a semiconductor device with an enlarged area comprising field effect thin film transistors using excellent polycrystalline silicon thin film semiconductor layers as constituent elements.

According to the present invention, there is provided a semiconductor element comprising its main part constituted of a polycrystalline silicon thin film semiconductor layer containing 0.01 to 1 atomic % of fluorine atoms (F).

DETAILED DESCRIPTION OF THE PREFERRED EMBODIMENTS

The field effect type thin film transistor (TFT) as an example of the semiconductor element of the present invention prepared using the polycrystalline silicon thin film as the base material is known as a transistor constituted of a semiconductor layer, an electrode layer and an insulating layer. That is, a voltage is applied between the source electrode and the drain electrode having ohmic contact adjacent to the semiconductor layer, and the channel current passing between said electrodes is modulated by the bias voltage applied to the gate electrode provided on the insulating layer.

Figure 1:
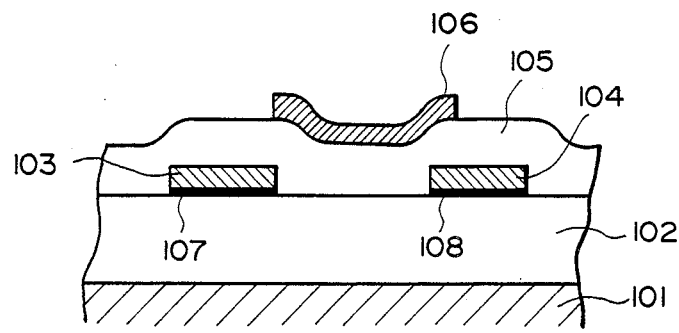
FIG. 1 shows a schematic sectional view for illustration of the semiconductor element of the present invention.

FIG. 1 shows an example of a typical basic structure of such TFT. On a semiconductor layer 102 provided on an insulating substrate 101 there are provided a source electrode 103 and a drain electrode 104 in contact with said semiconductor layer, and an insulating layer 105 is provided so as to cover over these electrodes, and a gate electrode 106 provided on said insulating layer 105.

In a TFT having the structure as shown in FIG. 1 in this invention, the semiconductor layer 102 is constituted of a polycrystalline silicon thin film having the characteristics as described above, and between the semiconductor layer 102 and each of the two electrodes, namely the source electrode 103 and the drain electrode 104, there are formed, for example, a first n+ layer 107 and a second n+ layer 108 each being constituted of an amorphous silicon, thus forming ohmic contact therebetween.

The insulating layer 105 may be constituted of a material such as silicon nitride layer, $SiO_2$ layer, $Al_2O_3$ layer and the like which can be formed according to the CVD (Chemical Vapour Deposition) method, LPCVD (Low Pressure Chemical Vapour Deposition) method or PCVD (Plasma Chemical Vapour Deposition) method.

As the reactive gas to be employed for preparation of the polycrystalline silicon thin film constituting the semiconductor layer, there may be included substances comprising silicon as constituent atoms, as exemplified by $SiF_4$, $Si_2F_6$, etc. which may also be diluted, if necessary, with gases such as $H_2$, Ar, He and the like.

The field effect type TFT as an example of the semiconductor element of the present invention, can be classified into a type in which a gate insulating layer is provided on a gate electrode (lower gate type) and a type in which a gate electrode is provided on a gate insulating layer (upper gate type). On the other hand, it may also be classified into a type in which source and drain electrodes are provided at the interface between the insulating layer and the semiconductor layer (Coplanar type) and a type in which source and drain electrodes are on the semiconductor plane confronting the interface between the insulating layer and the semiconductor layer (Stagger type). Thus, there are four types of combinations in all, as is well known in the art. The structure as shown in FIG. 1 is called as upper gate Coplanar type field effect TFT. In the present invention, any one of these types of field effect type TFT may be available as a matter of course.

In the present invention, various transistor chacteristics can be improved by controlling the fluorine (F) atom content in the polycrystalline silicon thin film constituting the semiconductor layer as the main part of the semiconductor element to a level of 0.01 atomic % or higher. The fluorine (F) atoms contained in the polycrystalline silicon thin film seem to exist primarily at the grain boundary of the polycrystalline silicon. From a number of experimental facts found by the present inventors, it has been observed that at a level of 1 atomic % or less of fluorine (F) atom content, substantially no deterioration, especially change with lapse of time, of transistor characteristics will occur, whereby the characteristics can be maintained stably. That is, for example, at a fluorine (F) atom level exceeding 1 atomic %, when the transistor is continuously actuated as described above, it has been observed that the effective carrier mobility $\mu$eff is decreased, and the output drain current is decreased with lapse of time with change in threshold voltage. In the present invention, the fluorine (F) atom content is generally 0.01 to 1 atomic %, but preferably 0.05 to 1 atomic %, most preferably 0.05 to 0.5 atomic %.

Measurement of the fluorine content in the polycrystalline silicon thin film in the semiconductor element of the present invention was conducted by means of a Fourier-transform infrared spectrometer (FTIR, produced by JAS Co., Model FTS15C/D), when the content was 0.1 atomic % or more. That is, as a support for FTIR, a mirror ground, silicon wafer substrate of a thickness of 500 $\mu$m and a size of 1 inch was washed thoroughly successively with distilled water and with deionized water, defatted with methyl ethyl ketone and washed with isopropanol, followed by drying. The fluorine content in the film was determined in such a manner that the absorption intensity of absorption band at 850 $cm^{-1}$ which is the stretching vibration mode of Si-F is integrated according to the half-width approximation method and the number of bound fluorine atoms was determined from the value obtained by the integration.

Measurement of a fluorine content less than 0.1 atomic % was conducted by means of a secondary ion mass spectrometer-SIMS-(Model IMS-3f, produced by Cameca Co.). A conventional method was followed in this analytical method. That is, for prevention of charge-up, gold was vapor deposited to a thickness of 200 Å on a thin film of the sample, and measurement was conducted under the conditions of an ion energy of primary ion beam of 8 KeV and a sample current of $5 \times 10^{-10}$ Å, with a spot size of 50 $\mu$m in diameter and an etching area of 250 $\mu$m $\times$ 250 $\mu$m, to determine the detection intensity ratio of $F^+$ ion relative to $Si^+$, from which the fluorine content was calculated in terms of atomic %.

On the other hand, in order to verify the quantitative nature of the fluorine contents determined by the above FTIR method and the SIMS method, fluorine contents were measured by the lanthanum-alizarin complexion absorptiometric method well known in chemical analysis, whereby coincidence of the FTIR method with the SIMS method was confirmed.

The change with lapse of time of the polycrystalline silicon thin film transistor for showing the effect of the present invention was measured according to the method as described below.

Figure 2:
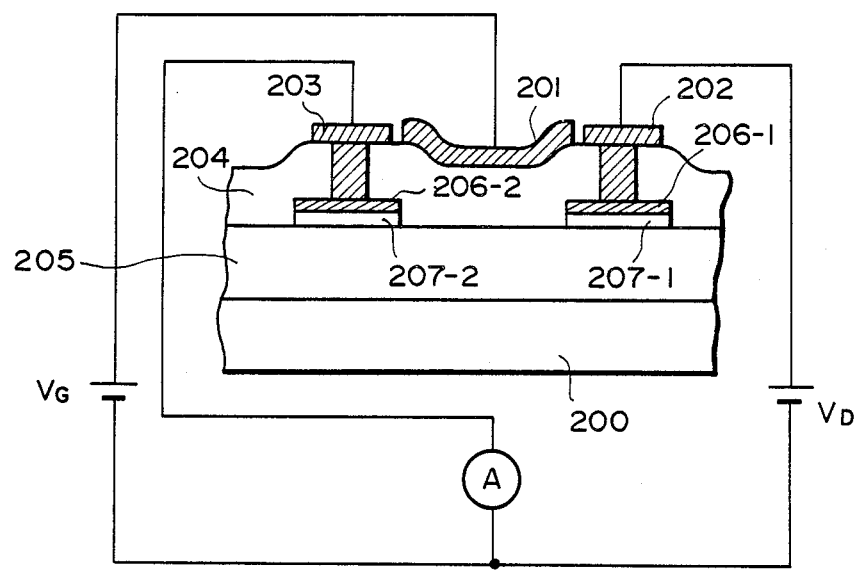
FIG. 2 shows a schematic view for illustration of the circuit for measurement of the characteristics of the semiconductor element of the present invention.

A TFT having a structure as shown in FIG. 2 was prepared, and by applying a gate voltage $V_G = 40$ V to the gate 201 and a drain voltage $V_D = 40$ V between the source 203 and the drain 202, the drain current $I_D$ flowing between the source 203 and the drain 202 was monitored by an electrometer (Keithley 610 C electrometer) to measure the change of the drain current with lapse of time. The percentage of the change with lapse of time was determined by dividing the change quantity of drain current after 500 hours continuous actuation by the initial drain current and multiplying the value obtained by 100 so as to be represented in %.

The threshold voltage $V_{TH}$ of TFT was defined, as conventionally conducted in MOS FET (Metal Oxide Semiconductor Field Effect Transistor), as the point at which the line extrapolated from the straight line portion in $$V_D - \sqrt{I_D}$$

curve crosses over the abscissa of $V_D$. The changes of $V_{TH}$ before and after the change with lapse of time were examined at the same time and the changed quantity was represented in volt.

The F content in the polycrystalline silicon thin film semiconductor layer can be restricted to the range as described above according to various methods. For example, it can be realized under the specific conditions according to the method in which a fluorinated silicon such as $SiF_4$ and the like is deposited by the glow discharge decomposition (GD), the method in which sputtering is effected using a Si target in a gas containing $F_2$ (SP), the method in which Si is subjected to vapor deposition by use of electron beam in a $F_2$ gas plasma atmospere (IP), as well as the method in which a polycrystalline silicon thin film formed by CVD or LPCVD is subjected to the $F_2$ gas plasma treatment, and so on. To be specifically noted in the present invention, the polycrystalline silicon thin film semiconductor layer formed by the GD method, the SP method and the IP method, even at a low temperature of 400° C. to 450° C., so long as the restriction of fluorine content is satisfied, can give transistor characteristics comparable to those of a polycrystalline silicon film conventionally known in the art as prepared by, for example, CVD or LPCVD at a higher temperature (at 600° C. or higher) followed by $H_2$ plasma annealing, and also can give more stability and reliability than such conventionally known film, thus indicating directly usefulness of the present invention.

Further, as the orientation at the (220) plane in the polycrystalline silicon thin film is intensified while satisfying the fluorine content in the thin film, the transistor characteristics, particularly the effective carrie mobility is recognized to be further improved, whereby the change with lapse of time on continuous actuation becomes little.

It is known in the art that polycrystalline silicon thin films can be obtained so as to have various crystallinity and orientation characteristics depending on the film preparation method and the film preparation conditions.

In the present invention, as the method for examination of the orientation characteristics, X-ray diffraction and electron beam diffraction we e performed in combination.

X-ray diffraction intensities of polycrystalline silicon films prepared were measured by X-ray diffractometer produced by Rigaku Denki (copper tube bulb, 35 KV, 10 mA) and comparison was made. The diffraction angle 2$\theta$ was varied from 20° to 65° and diffraction peaks at plane indices of (111) plane, (220) plane and (311) plane were detected to determine their diffraction intensities.

Electron beam diffraction intensities were measured by JEM-100 V produced by Nippon Denshi Co., and respective diffraction intensities were determined similarly. According to the ASTM card (No. 27-1977), in case of a polycrystalline silicon having no orientation at all, taking out only (220) from the planes in terms of (h, k, l) representation with greater diffraction intensities of (111):(220):(311) = 100:55:30, its ratio relative to the total diffraction intensities, namely diffraction intensity of (220)/(total diffraction intensity) is equal to $(55/241)\times 100 \approx 22.8$ (%).

With the use of this value as the standard, an orientation characteristic (220) with a greater value than the above percentage, especially 30% or more, can give further improved transistor characteristics. At a value less than 30%, the change with lapse of time becomes undesirably greater.

In the present invention, the maximum of the surface unevenness of the polycrystalline silicon thin film constituting the main part of a semiconductor element can be made 800 Å or less to achieve the effect of the present invention more effectively. The polycrystalline silicon thin film which is formed with a surface unevenness of 800 Å or less at the maximum shows no marked difference adversely affecting the element characteristics in crystallinity and orientation characteristic in the direction of film thickness as the result of dense crystal growth taking place from the substrate interface and can give good element characteristics also in case of forming a transistor element.

It is desirable to make the maximum of surface unevenness of the polycrystalline silicon thin film to preferably 800 Å or less, more preferably 500 Å or less. Further, it is desirable to make the maximum of the surface unevenness of polycrystalline silicon thin film constituting a semiconductor layer forming the main part of a semiconductor element to 800 Å or less over the entire surface region of the semiconductor layer which constitutes actually the element.

In the present invention, measurement of the surface unevenness was conducted by means of a field radiation type scanning electron microscope (Model JFSM-30, produced by Nippon Denshi Co.) and it was determined from an image of 100,000 x magnification of the surface cross-section of a polycrystalline silicon thin film with accelerated electrons under 25 KV incident on the surface obliquely.

As disclosed in the present invention, formation of a polycrystalline silicon thin film suited for the object of the present invention may be possible particularly by carrying out glow discharge decomposition (GD method) of a fluorinated silicon compound gas, sputtering of silicon in $F_2$ atmosphere (SP method) or ion plating method (IP method) at a substrate surface temperature of 500° C. or lower (in the range of about 400° to 500° C.). This fact is not only advantageous in uniform heating of substrate or provision of a cheap substrate material of large area in preparation of a driving circuit or a scanning circuit covering over a large area for a large area device, but also important in that it can satisfy the requirement that a light-transmissive glass plate is desirably used as a substrate for transmissive-type display device or in application of an image device such as in case of a photoelectric converting light-receiving element of the type in which light enters on the substrate side.

Accordingly, since the present invention can be practiced even at lower temperature zones as compared with the prior art techniques, low-melting glasses in general, heat-resistant plastics, etc. may also be available in addition to heat-resistant glasses such as high-melting glasses, hard glass, etc., heat-resistant ceramics, sapphire, spinel, silicon wafer, etc. conventionally used in the prior art.

As the glass substrate, there may be employed a regular glass having a softening point of 630° C., an ordinary hard glass having a softening point of 780° C., a ultrahard glass having a softening point of 820° C. (JIS First grade ultra-hard glass), etc.

In the preparation method of this invention, an advantage is involved in that films can be formed without impairing the substrate, because any substrate can be used at a substrate temperature which can be suppressed lower than the softening point of the substrate employed.

In Examples of the present invention, there was primarily employed as the substrate glass Corning #7059 glass among the regular glasses (soda glasses) having relatively low softening points, but it is of course possible to use a quartz glass having a softening point of 1,500° C. as the substrate. However, from practical standpoint, the use of regular glasses is advantageous in preparation of thin film transistors, TFT at low cost and over a large area.

The field effect thin film transistor (FE-TFT) as an example of the semiconductor element prepared with the use of the polycrystalline silicon thin film as the base material can be improved in transistor characteristics (effective carrier mobility, threshold voltage, ON/OFF ratio, gm, etc.), without change of transistor characteristics with lapse of time on continuous running, and also improved in yield of the element and further reduced in fluctuation of the characteristics. Therefore, it is suitable as an element constituting a scanning circuit or a driving circuit of a display device or image device utilizing LC (Liquid crystal), EL (Electroluminescence) or EC (Electrochromy).

In order to further illustrate the present invention, preparation of polycrystalline silicon thin films, preparation process of TFT and the results of TFT behaviors are described in detail below by way of Examples.

EXAMPLE 1

Figure 3:
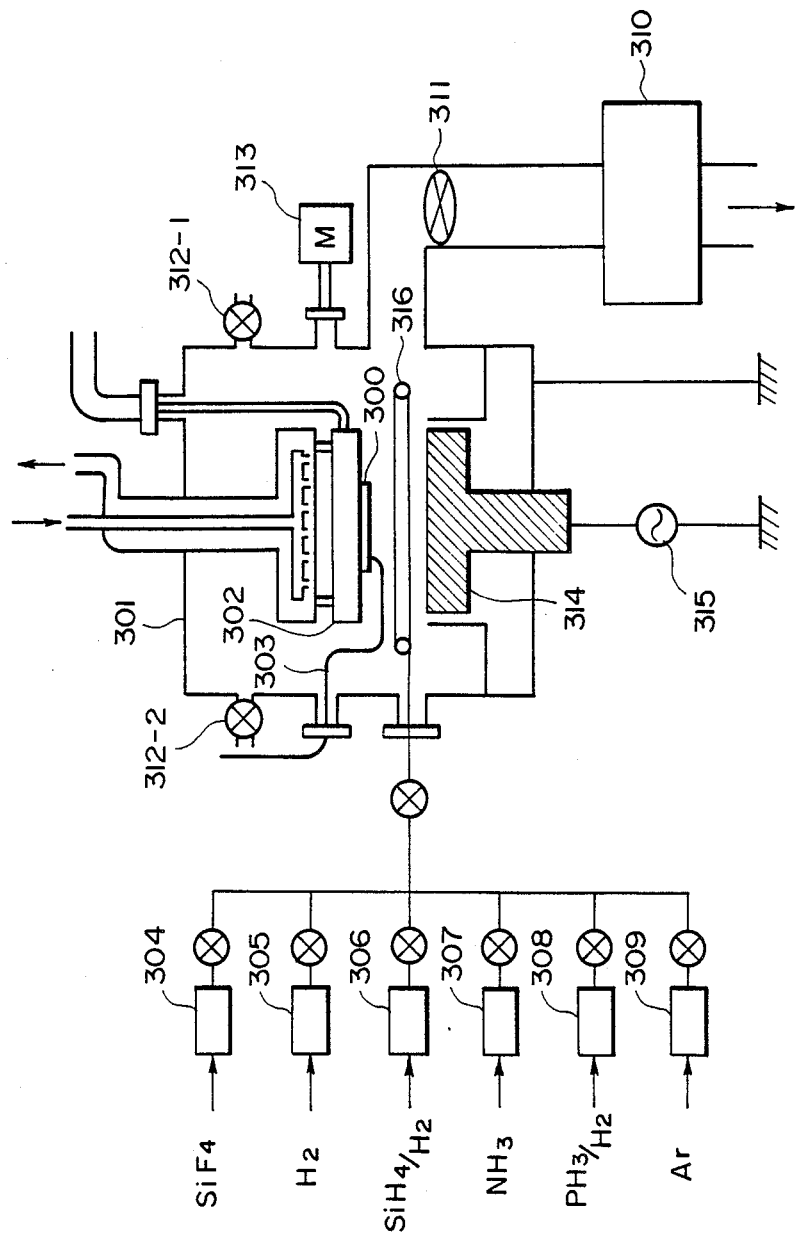
FIGS. 3 and 5 each show a schematic sectional view for illustration of an example of a device for preparation of a semiconductor film of the present invention.

This example describes preparation of a TFT by formation of a polycrystalline silicon thin film on a substrate by means of the device as shown in FIG. 3. As the substrate 300, Corning #7059 glass was used.

First, after the substrate 300 was washed, it was lightly etched on its surface with a mixture of ($HF + HNO_3 + CH_3COOH$) and after drying mounted on a substrate heating holder 302 placed on the anode side in a bell-jar vacuum deposition chamber 301.

Then, the bell-jar 301 was evacuated by a diffusion pump 310 to a background vacuum degree of $2 \times 10^{-6}$ Torr or less. During this operation, if the vacuum degree is poor, a reactive gas does not effectively take part in the film deposition, and moreover entrainment of oxygen atoms (O), nitrogen atoms (N) may also occur in the film to thereby change markedly the dark resistance of the film. Next, the substrate temperature Ts was raised and the substrate 300 was maintained at 500° C. (the substrate temperature was monitored by a thermocouple 303).

In this Example, as the reactive gase to be introduced, a gas mixture of $SiF_4$ gas and $H_2$ gas was employed. The gas flow rate of $SiF_4$ was controlled to 20 SCCM through a mass flow controller 304, while that of $H_2$ to 10 SCCM through a mass flow controller 305.

The pressure in the bell-jar 301 was set at 0.15 Torr by means of an absolute pressure gage 313 by controlling the pressure control valve 311 on the evacuation side of the bell-jar 301. After the pressure in the bell-jar 301 was stabilized, a high frequency electric field of 13.56 MHz was applied from a power source 315 to the cathode electrode 314 to commence glow discharging. The voltage was 0.5 KV, with the current being 48 mA and RF discharging power 100 W. The film formed had a thickness of 5000 Å and its uniformity degree was within ±10% relative to the substrate dimension of $120 \times 120$ mm when employing a ring-shaped gas blowing outlet.

The film formed contained 0.2 atomic % of fluorine atoms.

The orientation characteristic of the above thin film was examined from the X-ray diffraction data so that it was 90% [$=I(220)/I(total) \times 100$].

Figure 4:
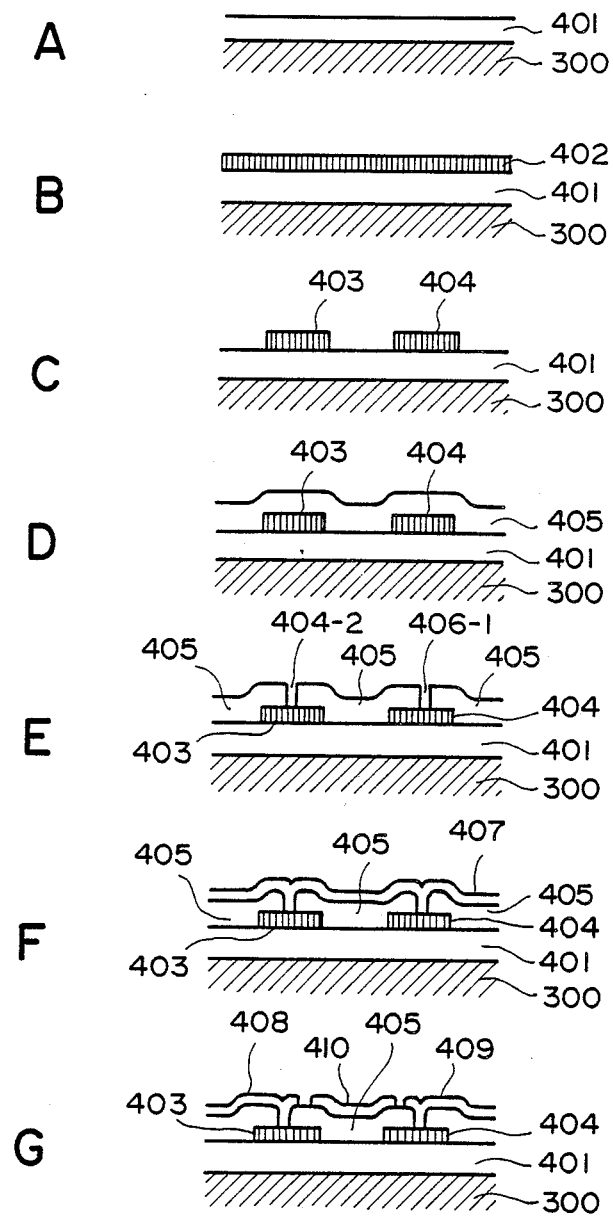
FIG. 4 shows a schematic chart for illustration of the steps for preparation of the semiconductor element of the present invention.

As the next step, following the process as shown in FIG. 4, a TFT was prepared using this film as the base material. As shown in the step A, after deposition of a polycrystalline silicon film 401 formed on the glass substrate 300 as described above, $PH_3$ gas diluted to 100 vol ppm with hydrogen gas [abbreviated as $PH_3$(100 ppm)/$H_2$] was permitted to flow into the bell-jar 301 at a molar ratio of $5 \times 10^{-3}$ relative to $SiH_4$ gas diluted to 10 vol % with $H_2$[abbreviated as $SiH_4(10)/H_2$] to adjust the pressure in the bell-jar 301 to 0.12 Torr, whereupon glow discharging was effected to form a n+ layer 402 doped with P to a thickness of 500 Å (step B). Subsequently, as the step C, the n+ layer 402 was removed by photoetching except for the regions of the source electrode 403 and the drain electrode 404. Then, the above substrate was mounted again onto the heating holder 302 on the anode side in the bell-jar 301 so as to form a gate insulating film thereon. Similarly as in formation of the polycrystalline silicon thin film, the bell-jar 301 was evacuated, the substrate temperature Ts maintained at 250° C. and glow discharging was excited by introduction of $NH_3$ gas at 20 SCCM and $SiH_4(10)/H_2$ gas at 5 SCCM, whereby SiNH film 405 was deposited to a thickness of 2500 Å.

Next, contact holes 406-1 and 406-2 for the source electrode 403 and the drain electrode 404 were made by the photoetching step, and thereafter an electrode film 407 was formed on the entire surface of the SiNH film 405 by vapor deposition of Al, followed by working of the Al electrode film 407 by the photoetching step to form the lead-out electrode 408 for the source electrode, the lead-out electrode 409 for the drain electrode and the gate electrode 410. Thereafter, heat treatment was conducted at 250° C. in $H_2$ atmosphere. The thin film transistor (channel length $L=10\mu$, channel width $W=500\mu$) formed according to the process under the conditions as described above was found to exhibit stable and good characteristics.

Figure 6:
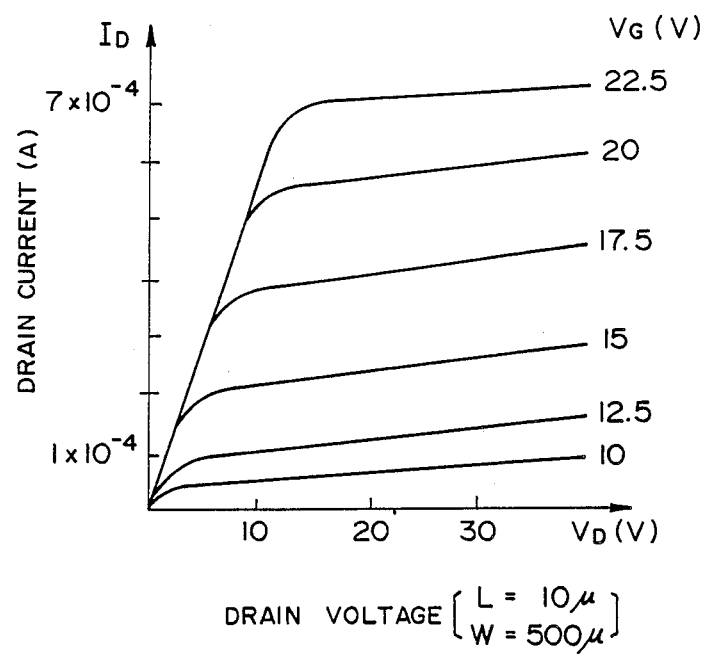
FIG. 6 shows a graph for illustration of one example of $V_d$-$I_D$ characteristics of the semiconductor element of the present invention.

FIG. 6 shows $V_D$-$I_D$ curve as an exemplary characteristic of the thus prepared TFT. (In FIG. 6, $V_D$ is the drain voltage, $V_G$ is the gate voltage and $I_D$ is the drain current.) At $V_G=20$ V, $I_D=2.0 \times 10^{-4}$ A, and at $V_G=0$ V, $I_D=1 \times 10^{-7}$ A, and the threshold voltage was 2.0 V. The effective mobility ($\mu$eff) as obtained from the straight line portion of $$V_G - \sqrt{I_D}$$

curve as generally practiced in MOS-TFT devices was found to be 8.0 cm$^2$/V.sec. Thus, a TFT having good transistor characteristics was obtained. For examination of stability of this TFT, DC voltage was continuously applied to the gate at $V_G=40$ V, and measurement of change of $I_D$ was continuously conducted over 500 hours. As the result, there was substantially no change of $I_D$, the change being within ±0.1%. And, there was also no change in threshold voltage, $\Delta V_{TH}$, before and after the continuous measurement, thus indicating extremely good stability of the TFT. $V_D$-$I_D$, $V_{G\text{-}ID}$ characteristics were also measured after such a continuous measurement to find that they were not changed in comparison to those before the continuous measurement, with μeff value also remaining the same, 8.0 cm²/V.sec.

As shown in this Example, the TFT of which main part is constituted of a polycrystalline silicon thin film with a fluorine atom content of 0.2 atomic % having the characteristics of 90% orientation and an average crystal grain size of 900 Å exhibits high performance.

EXAMPLE 2

According to the same procedure as in Example 1, a polycrystalline silicon film was formed on a Vycor glass substrate under the conditions of RF power (Po) of 150 W, SiF$_4$ flow rate of 20 SCCM, H$_2$ flow rate of 10 SCCM and glow discharge pressure (Pr) of 0.12 Torr. The substrate temperature (Ts) was set from 350° C. to 700° C. at intervals of 50° C. until the film was formed to have a thickness of 0.5μ. Polycrystalline silicon films having various fluorine atom contents and orientation characteristics were formed, and TFT's prepared according to the same method as in Example 1 by using the respective films were found to have effective mobility values (μeff) as shown in Table 1.

TABLE 1

| Sample No. | | 1-1 | 1-2 | 1-3 | 1-4 | 1-5 | 1-6 | 1-7 | 1-8 |
|---|---|---|---|---|---|---|---|---|---|
| Ts | (°C.) | 350 | 400 | 450 | 500 | 550 | 600 | 650 | 700 |
| Fluorine atom content | atomic (%) | 1.5 | 0.8 | 0.6 | 0.5 | 0.4 | 0.2 | 0.05 | <0.01 |
| Orientation degree | (%) | 28 | 58 | 80 | 85 | 90 | 95 | 95 | 90 |
| μeff | (cm²/V·sec) | 0.7 | 1.5 | 3.2 | 5.5 | 8.0 | 4.5 | 1.6 | 0.5 |
| I$_D$ change with lapse of time | (%) | 1.5 | 0.4 | ≦0.1 | ≦0.1 | ≦0.1 | ≦0.1 | ≦0.1 | 2.0 |

As seen from Table 1, the samples with fluorine atom contents in excess of 1 atomic % or less than 0.01 atomic % have an effective mobility of less than 1 cm²/V.sec., and a sample with an orientation degree less than 30% has an effective mobility value less than 1 cm²/V.sec. Therefore, those samples are inferior in practical application.

Further, the sample at Ts=700° C. has a high orientation of 90%, but a small content of fluorine atoms less than 0.01 atomic % makes the effective carrier mobility (μeff) as small as 0.7 cm²/V.sec. so that it is also inferior in practical application.

From Table 1, it can be seen that the sample (1-1) with a fluorine atom content over 1 atomic % and the sample (1-8) with a fluorine atom content less than 0.01 atomic % are inferior in performances of TFT, namely μeff and change of I$_D$ with lapse of time.

EXAMPLE 3

A Corning #7059 glass substrate prepared similarly as in Example 1 was fixed in close contact with a substrate heating holder 302 on the anode side in the bell-jar 301, and a polycrystalline silicon plate (not shown: purity 99.99%) was placed on the electrode plate of the lower cathode 314 so as to be opposed to the substrate 300. The bell-jar 301 was evacuated by means of a diffusion pump to 2×10⁻⁶ Torr, and the surface temperature of the substrate 300 was maintained at 450° C. by heating of the substrate heating holder 302.

Subsequently, SiF$_4$ gas was introduced into the bell-jar 301 while controlling its flow rate through a mass flowmeter 304 to 0.25 SCCM, and further Ar gas introduced into the bell-jar 301 while controlling its flow rate through a mass flowmeter 309 to 25 SCCM, followed by narrowing of the main valve 311 to set the inner pressure in the bell-jar at 0.005 Torr.

After the inner pressure in the bell-jar was stabilized, a voltage of 2.6 KV was applied to the lower cathode 314 by the high frequency power source 315 of 13.56 MHz to excite glow discharging between the polycrystalline silicon plate on the cathode 314 and the anode (substrate heating holder) 302 at a discharge power of 300 W, whereby a film with a thickness of about 0.5μ was formed.

The thus formed polycrystalline silicon film was found to have a fluorine atom content of 0.5 atomic and an orientation degree of 55%.

Subsequently, by utilizing a part of the above film, a TFT was prepared according to the same steps as in Example 1. This element exhibited an effective mobility μeff of 2.2 cm²/V.sec., and when changes in I$_D$, and Vth were measured under the conditions of V$_G$=V$_D$=40 V, after 500 hours, I$_D$ change was found to be 0.2%, while there was observed no change in Vth, thus exhibiting good stability.

COMPARATIVE EXAMPLE

For the purpose of comparison with the above sample, the following sample was prepared and similar measurements were conducted.

A Corning #7059 glass substrate prepared similarly as in Example 1 was fixed in close contact with a substrate heating holder 302 on the anode side in the bell-jar 301, and a polycrystalline silicon plate (not shown: purity 99.99%) was placed on the electrode plate of the lower cathode 314 so as to be opposed to the substrate. The bell-jar 301 was evacuated by means of a diffusion pump to 2×10⁻⁶ Torr, and the surface temperature of the substrate 300 was maintained at 350° C. by heating of the substrate heating holder 302. Subsequently, SiF$_4$ gas was introduced into the bell-jar through a mass flowmeter 304 at 1 SCCM, and further Ar gas introduced into the bell-jar 301 through a mass flowmeter 309 at a flow rate of 25 SCCM, followed by narrowing of the main valve 311 to set the pressure in the bell-jar at 0.005 Torr.

After the inner pressure in the bell-jar was stabilized, a voltage of 2.6 KV was applied to the lower cathode 314 by the high frequency power source 315 of 13.56 MHz to excite glow discharging between the polycrystalline silicon plate on the cathode and the anode (substrate heating holder) 302. The RF discharge power (travelling wave power-reflection wave power) was 300 W, whereby a film with a thickness of about 0.5μ was formed.

The thus formed polycrystalline silicon film was found to have a fluorine atom content of 2.5 atomic and an orientation degree of less than 30%.

Subsequently, a TFT was prepared according to the same steps (A-G) as in Example 1.

This element exhibited an effective mobility μeff of 0.2 cm²V.sec. and when changes in $I_D$ and Vth were measured under the conditions of $V_G=V_D=40$ V, after 500 hours, $I_D$ change was found to be reduced by 12% and ΔVth was 3 V, thus exhibiting poor stability of TFT.

EXAMPLE 4

Figure 5:
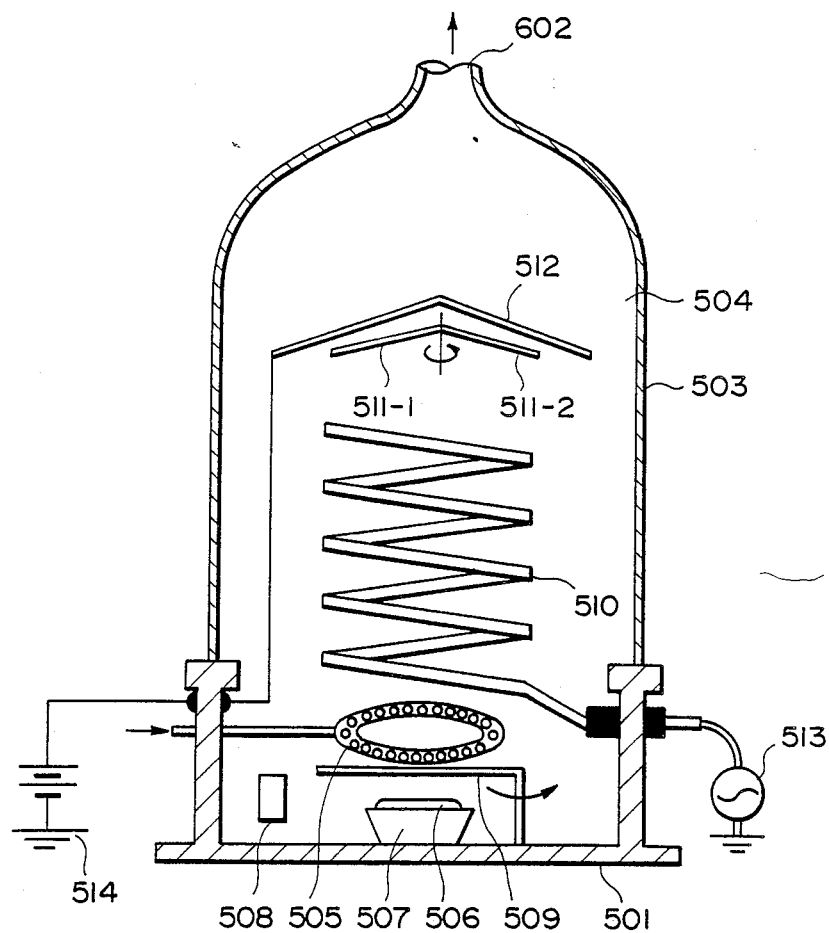

An example is to be described below, in which a thin film transistor was formed with the use of a polycrystalline silicon thin film semiconductor layer prepared by means of the ion-plating deposition device as shown in FIG. 5.

First, in a deposition chamber 503 which can be brought to reduced pressure, there was placed a non-doped polycrystalline silicon body to be evaporated 506 in a boat 507, and a Corning #7059 substrate was placed on the supports 511-1 and 511-2. After the deposition chamber 503 was evacuated to a base pressure of about $1\times10^{-7}$ Torr, a $F_2$ gas with purity of 99.999% was introduced through the gas inlet tube 505 into the deposition chamber so that the partial pressure of the $F_2$ gas ($P_{F2}$) might be $4\times10^{-5}$ Torr. The gas inlet tube 505 employed had an inner diameter of 2 mm and shaped at its tip in a loop having gas blowing openings of 0.5 mm at intervals of 2 cm.

Then, high frequency of 13.56 MHz was applied to the high frequency coil 510 (5 mm in diameter) to set the output at 100 W, whereby a high frequency plasma atmosphere was formed at the inside portion of the coil.

On the other hand, while rotating the supports 511-1 and 511-2, the heating device 512 had been brought to the state under actuation and heated to about 450° C. As the next step, the evaporating body 506 was irradiated and heated by the electron gun 508, whereby permitting silicon particles to fly. The electron gun had a power of about 0.5 KW, and a polycrystalline silicon thin film of 0.5μ was formed. With the use of this thin film, a thin film transistor was prepared according to the same process a in the foregoing Examples. Table 2 shows the fluorine atom contents in the film and the effective mobility (μeff) of the thin film transistor prepared. At the same time, there are shown the results of the case when the film was prepared under a partial fluorine gas pressure $P_{F2}$ of $2\times10^{-4}$ Torr and the case when the film was formed without introduction of fluorine gas.

TABLE 2

| Sample No. | 4-1 | 4-2 | 4-3 |
|---|---|---|---|
| Partial pressure of fluorine gas, $P_{F2}$ (Torr) | 0 | $4\times10^{-5}$ | $2\times10^{-4}$ |
| Fluorine atom content (atomic %) | 0 | 0.8 | 2.0 |
| Orientation degree | 28 | 45 | 45 |
| μeff (cm²/V · sec) | 0.02 | 1.5 | 0.4 |

We claim:
1. A semiconductor element comprising as its main constituent part a polycrystalline silicon semiconductor layer containing 0.01 to 1 atomic % of fluorine atoms, wherein said semiconductor layer has an X-ray diffraction pattern or an electron beam diffraction pattern, of which the diffraction intensity at the (220) plane is 30% or more based on the total diffraction intensity.

2. A semiconductor element according to claim 1, wherein the substrate on which the polycrystalline silicon semiconductor layer is formed is a glass.

3. A field effect type thin film transistor comprising:
   a semiconductor layer constituted of a polycrystalline silicon thin film containing 0.01 to 1 atomic % of fluorine atoms and formed with a surface unevenness of 800 Å or less at the maximum;
   an electrical insulating layer having one side electrically in contact with the semiconductor layer;
   a gate electrode provided on the side of the insulating layer opposite to the side which is in contact with the semiconductor layer; and
   a source electrode and a drain electrode provided on the semiconductor layer and electrically in contact therewith.

4. A field effect type thin film transistor according to claim 3, wherein n+ semiconductor layers are provided respectively between the semiconductor layer and each of the source electrode and the drain electrode.

5. A field effect type thin film transistor according to claim 4, wherein the n+ semiconductor layers each are of amorphous silicon.

6. A field effect type thin film transistor according to claim 3, wherein the insulating layer is of a material selected from among silicon nitride, $SiO_2$ and $Al_2O_3$.

7. A field effect type thin film transistor according to claim 3, wherein the fluorine atoms contained in the polycrystalline silicon thin film exist primarily at the grain boundaries of the polycrystalline silicon.

* * * * *

UNITED STATES PATENT AND TRADEMARK OFFICE
CERTIFICATE OF CORRECTION

PATENT NO. : 4,982,251

DATED : January 1, 1991

INVENTOR(S) : Katsumi Nakagawa, et al.

It is certified that error appears in the above-identified patent and that said Letters Patent is hereby corrected as shown below: Title page:

[56]   References Cited

Under "OTHER PUBLICATIONS", "Phys. Stat. 502," should read --Phys. Stat. Sol. 502,--.

[57]   ABSTRACT

Line 1, "comprises its" should read --comprises as its--; and "con-" should be deleted.

Line 2, "stituted of" should be deleted.

COLUMN 2:

Line 49, "$V_d$-$I_D$ characteristics" should read --$V_D$-$I_D$ characteristics--.

COLUMN 7:

Line 49, "gase" should read --gas--.

COLUMN 8:

Line 65, "$V_{G-ID}$" should read --$V_G$-$I_D$--.

UNITED STATES PATENT AND TRADEMARK OFFICE
CERTIFICATE OF CORRECTION

PATENT NO. : 4,982,251

DATED : January 1, 1991

INVENTOR(S) : Katsumi Nakagawa, et al.

It is certified that error appears in the above-identified patent and that said Letters Patent is hereby corrected as shown below:

COLUMN 12:

After line 50, insert the following:

--8. A field effect type thin film transistor comprising:
a semiconductor layer constituted of a polycrystalline silicon thin film containing 0.01 to 1 atomic % of fluorine atoms and having an x-ray diffraction pattern or an electron beam diffraction pattern, of which the diffraction intensity at the (220) plane is 30% or more based on the total diffraction intensity;
an electrical insulating layer having one side electrically in contact with the semiconductor layer;
a gate electrode provided on the side of the insulating layer opposite to the side which is in contact with the semiconductor layer; and
a source electrode and a drain electrode provided on the semiconductor layer and electrically in contact therewith.

9. A field effect type thin film transistor according to Claim 8, wherein $n^+$ semiconductor layers are provided respectively between the semiconductor layer and each of the source electrode and the drain electrode.

10. A field effect type thin film transistor according to Claim 9, wherein the $n^+$ semiconductor layers each are of amorphous silicon.

11. A field effect type thin film transistor according to Claim 8, wherein the insulating layer is of a material selected from among silicon nitride, $SiO_2$ and $Al_2O_3$.

UNITED STATES PATENT AND TRADEMARK OFFICE
CERTIFICATE OF CORRECTION

PATENT NO. : 4,982,251

DATED : January 1, 1991

INVENTOR(S) : Katsumi Nakagawa, et al.

It is certified that error appears in the above-identified patent and that said Letters Patent is hereby corrected as shown below:

COLUMN 12 (continued) :

12. A field effect type thin film transistor according to Claim 9, wherein the fluorine atoms contained in the polycrystalline silicon thin film exist primarily at the grain boundaries of the polycrystalline silicon.--.

Signed and Sealed this

Tenth Day of November, 1992

Attest:

DOUGLAS B. COMER

Attesting Officer

Acting Commissioner of Patents and Trademarks